US006480535B1

United States Patent
Witmayer

(10) Patent No.: US 6,480,535 B1
(45) Date of Patent: Nov. 12, 2002

(54) GENERATING MULTI-CHANNEL OUTPUTS SIMULTANEOUSLY IN A RECEIVER USING POLYPHASE FILTER

(75) Inventor: Eric F. Witmayer, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/360,603

(22) Filed: Jul. 26, 1999

(51) Int. Cl.[7] .................................................. H03H 7/30
(52) U.S. Cl. ........................................ 375/232; 375/350
(58) Field of Search ................................. 375/229, 254, 375/252, 235, 340, 343, 371, 350, 376, 240.02, 316, 329, 308; 708/320, 322, 323, 290, 300, 314, 319, 313; 376/290, 291, 465; 381/71.11; 386/50, 73; 455/302, 326

(56) References Cited

U.S. PATENT DOCUMENTS

| 5,151,702 A | * | 9/1992 | Urkowitz | 342/134 |
|---|---|---|---|---|
| 5,341,107 A | * | 8/1994 | Bijker et al. | 329/337 |
| 5,699,363 A | * | 12/1997 | Wishart et al. | 370/497 |
| 5,710,763 A | * | 1/1998 | Harrison | 370/307 |
| 5,870,436 A | * | 2/1999 | Kolanek et al. | 375/316 |
| 5,943,369 A | * | 8/1999 | Knutson et al. | 375/326 |
| 6,035,186 A | * | 3/2000 | Moore et al. | 455/313 |
| 6,226,509 B1 | * | 5/2001 | Mole et al. | 455/302 |
| 6,324,559 B1 | * | 11/2001 | Hellberg | 708/321 |

* cited by examiner

Primary Examiner—Chi Pham
Assistant Examiner—Emmanuel Bayard
(74) Attorney, Agent, or Firm—Blakely, Sokoloff, Taylor & Zafman LLP

(57) ABSTRACT

The present invention is a method and apparatus to generate one or more channel outputs from an input signal having N channels. The input signal is filtered by a polyphase filter to generate N filtered signals. The one or more channel outputs are extracted from the N filtered signal based on one or more phasors corresponding to the one or more channel outputs.

15 Claims, 6 Drawing Sheets

GENERATING MULTI-CHANNEL OUTPUTS SIMULTANEOUSLY IN A RECEIVER USING POLYPHASE FILTER

BACKGROUND

1. Field of the Invention

This invention relates to communication. In particular, the invention relates to multi-channel receivers.

2. Description of Related Art

A typical multi-channel broadcast signal has a number of channels occupying allocated bandwidths. A receiver equipment receives a multi-channel signal and can generate the output for each channel one at a time. A channel selector in the receiver equipment can only allow the selection of one channel output at a time. For example, a television (TV) receiver allows the user to select a TV channel to be displayed on the screen.

In many cases, it is desirable to be able to select many or all channels in the multi-channel signal for multiple purposes. For example, a user may want to watch a sport event while taping a TV show simultaneously. Traditional techniques to provide multiple channel outputs require redundant hardware with separate tuner and channel selectors. These techniques result in hardware complexity and difficulty in selecting the desired channel outputs.

Therefore there is a need in the technology to provide a simple and flexible method to generate multiple channel outputs simultaneously using a single receiver system.

SUMMARY

The present invention is a method and apparatus to generate one or more channel outputs from an input signal having N channels. The input signal is filtered by a polyphase filter to generate N filtered signals. The one or more channel outputs are extracted from the N filtered signal based on one or more phases corresponding to the one or more channel outputs.

BRIEF DESCRIPTION OF THE DRAWINGS

The features and advantages of the present invention will become apparent from the following detailed description of the present invention in which.

DESCRIPTION

The present invention is a method and apparatus to generate multi-channel outputs in a single receiver. The technique uses a polyphase filter and a channel selector. The channel selector multiplies the outputs of the polyphase filter with the phasors of the selected channel and sums all the resulting product to generate the channel outputs. The technique is simple and flexible.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention.

Figure 1:
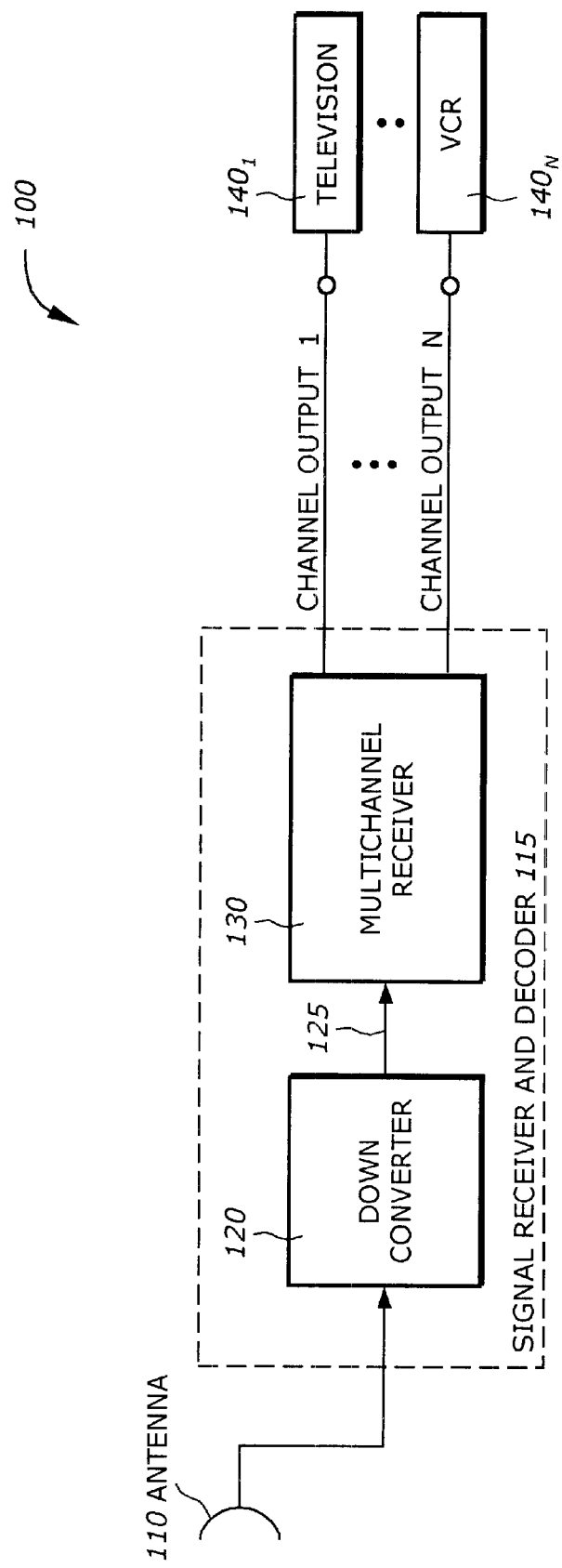
FIG. 1 is a diagram illustrating a system in which one embodiment of the invention can be practiced.

FIG. 1 is a diagram illustrating a system 100 in which one embodiment of the invention can be practiced. The system 100 includes an antenna 110, a signal receiver and decoder 115, a television (TV) receiver $140_1$ and a video cassette recorder (VCR) $140_N$.

The antenna 110 receives the multi-channel transmitted signal. The multi-channel signal may be transmitted over any medium from any appropriate sources. Examples include ground stations or satellites. The multi-channel signal may occupy any appropriate frequency bandwidth and may include video or audio signals or any combination thereof.

The signal receiver and decoder 115 is a device that receives and decodes the transmitted signals. The signal receiver and decoder 115 may be an integrated receiver and decoder used in a direct satellite system (DSS) or a set-top box used to receive video programs for television. The signal receiver and decoder 115 includes a down converter 120 and a multi-channel receiver 130.

The down converter 120 converts the radio frequency (RF) received signal to a frequency bandwidth that can be processed by the multi-channel receiver 130. The down converted frequency bandwidth may be at baseband or intermediate frequency (IF). The down converter 120 typically is a demodulator with local oscillators operating at the desired frequencies. The output of the down converter 120 is a multi-channel signal x(t) 125 having multiple frequency bandwidths corresponding to the receiver channels.

The multi-channel receiver 130 receives the multi-channel signal x(t) 125 and generates the selected channel outputs simultaneously. The selected channel outputs include the channel output 1 through N where N is a positive integer. In the exemplary system shown in FIG. 1, the channel output 1 is connected to a television set $140_1$ and the channel output N is connected to a video cassette recorder (VCR) $140_N$. The number of the selected channel outputs is equal or less than the number of channel bandwidths allocated in the transmitted signal. In addition to the TV set $140_1$ and the VCR $140_N$, any other receiver equipment can be used.

Figure 2:
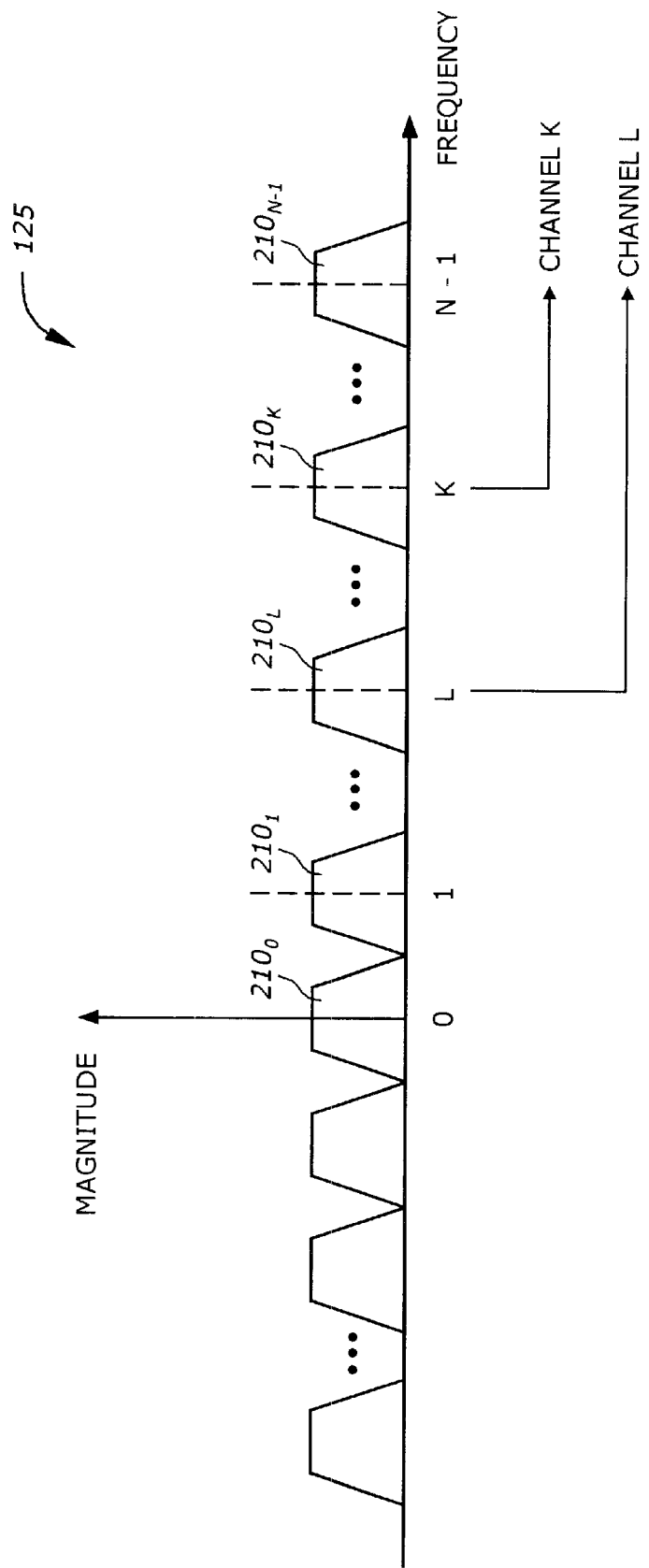
FIG. 2 is a diagram illustrating a multi-channel input signal according to one embodiment of the invention.

FIG. 2 is a diagram illustrating a multi-channel input signal 125 according to one embodiment of the invention.

The multi-channel input signal x(t) 125 has N channels occupying at N non-overlapping frequency bandwidths $210_0, 210_1, \ldots, 210_{N-1}$. In the exemplary diagram of FIG. 2, it is desired the extract channels L and K as shown. The channels L and K are extracted using the multi-channel receiver 130.

To extract the channels L and K from the multi-channel input signal x(y) 125, a user selects the desired channels from a channel selector. The multi-channel receiver 130 receives the user selection and generates the selected channel outputs simultaneously.

Figure 3:
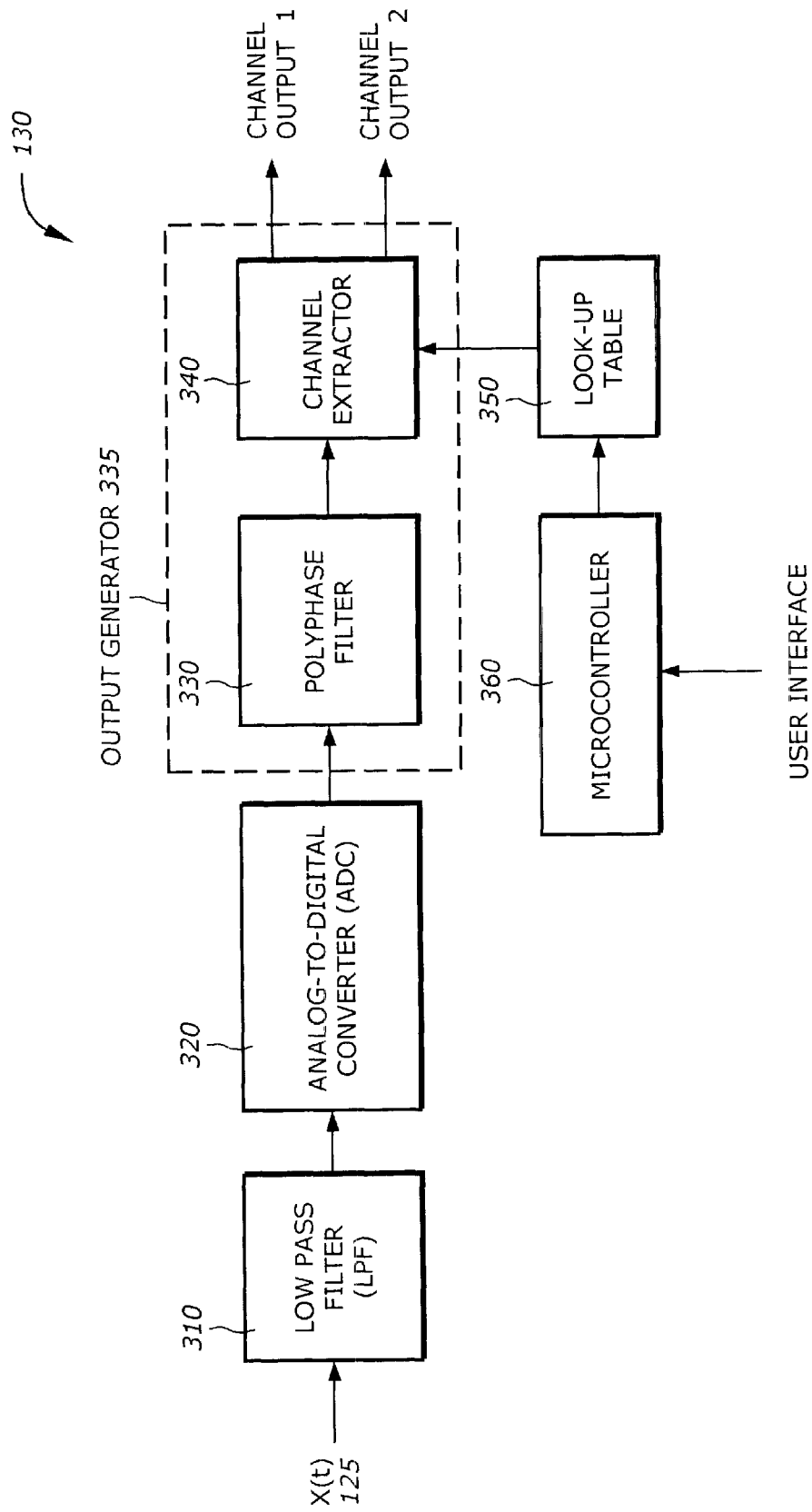
FIG. 3 is a diagram illustrating a multi-channel receiver according to one embodiment of the invention.

FIG. 3 is a diagram illustrating a multi-channel receiver 130 according to one embodiment of the invention. The multi-channel receiver 130 includes a low pass filter (LPF) 310, an analog-to-digital converter (ADC) 320, an output generator 335, a look-up table (LUT) 350, and a microcontroller 360.

The LPF 310 low pass filters the multi-channel input signal x(t) 125 to eliminate high frequency noise and prevent anti-aliasing effects. Typically the LPF 310 has a passband covering all the allocated frequency bandwidths of all N channels with some additional guardband. The ADC 320 digitizes the low pass filtered input signal to generate a sequence of digitized samples. Typically, the ADC 320 is a high speed digitizer which can operate at the highest frequency of the input signal x(t) 125. The output generator 335 includes a polyphase filter 330 and a channel extractor 340. The polyphase filter 330 is a digital filter to generate N filtered signals which are used to extract the desired channel outputs. The channel extractor 340 receives the phasors provided by the LUT 350 and the N filtered signals from the polyphase filter 330 to provide the channel outputs 1 and 2. In the exemplary diagram of FIG. 3, two channel outputs are shown. Of course any number of channel outputs can be generated.

The LUT 350 is a storage device to store known phasors of the corresponding channels embedded in the multi-channel input signal x(t). These phasors are selected and computed off-line to provide a canceling effect to the multi-channel input signal so that only the selected channel outputs are produced in the channel extractor 340. The LUT 350 may be implemented by any storage device such as a random access memory (RAM), a read-only memory (ROM), a programmable ROM, or a flash memory. As is known by one skilled in the art, a phasor is a vector element having a magnitude and an angle, represented by the $Ae^{j\theta}$ where A is the magnitude and $\theta$ is the angle. Alternatively, a phasor can also be represented by real and imaginary values.

The microcontroller 360 is a processor that receives the user inputs from the user interface and index the LUT 350. The user interface provides a means for the user to select the desired output channels.

Figure 4:
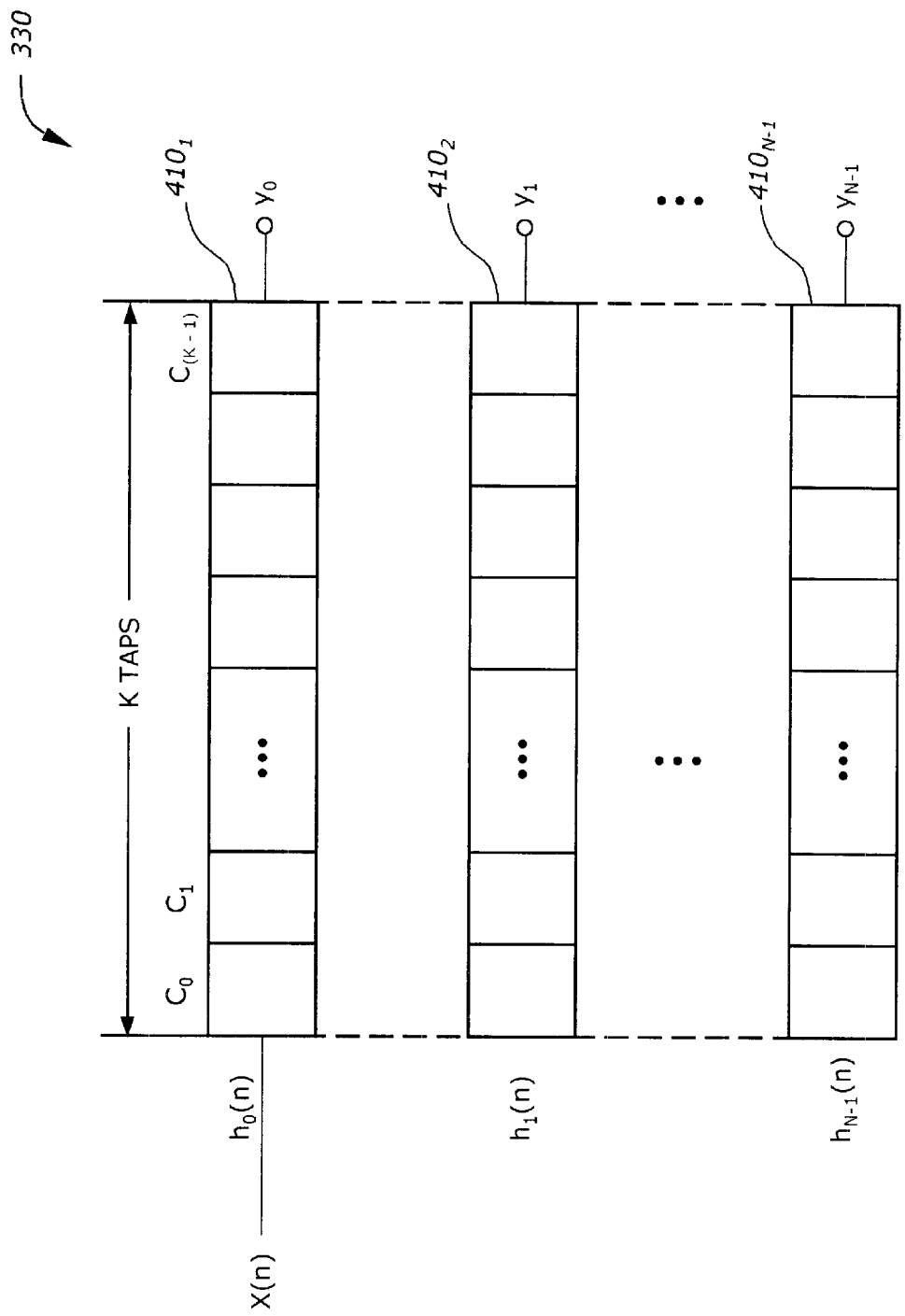
FIG. 4 a diagram illustrating a polyphase filter according to one embodiment of the invention.

FIG. 4 is a diagram illustrating a polyphase filter 330 according to one embodiment of the invention. The polyphase filter 330 is a P-tap non-recursive having P filter coefficients arranged in a two-dimensional array having N rows $410_0$ through $410_{N-1}$ corresponding to the filters h(0) through h(N−1).

The 2-D array stores the filter coefficients as N rows of K columns, where K=P/N. The number of rows is equal to the number of channels in the multi-channel input signal x(t) 125 shown in FIG. 1. Each of the N rows corresponds to a K-tap non recursive filter.

This mapping of the P-tap non recursive filter can be visualized as mapping the P-tap into a 2-D array with N rows and P/N columns by filling successive columns in natural order. Thus, the first column contains the first N points, the second column contains the next N points, and so on. The rows of this 2-D array are the polyphase filter sets with the j-th set holding the weights or filter coefficients to compute the j-th interpolated output point located j/N fraction of the input inter-sample interval.

The outputs of the polyphase filter 330 include N outputs $y_0$ through $y_{N-1}$ of the N corresponding K-tap non recursive filters $410_0$ through $410_{N-1}$. These outputs are then used by the channel extractor to generate the selected channel outputs.

Figure 5:
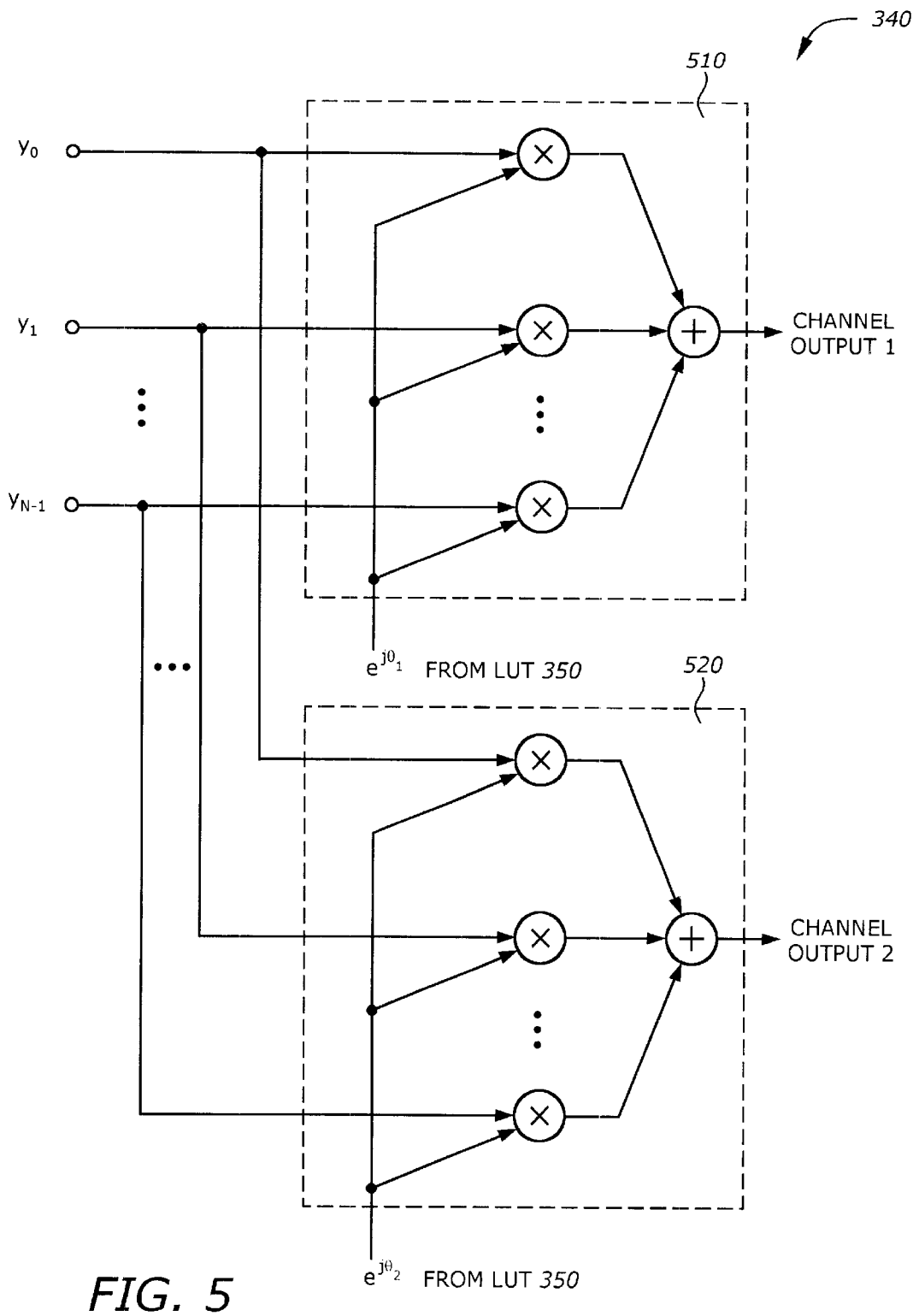
FIG. 5 is a diagram illustrating a channel extractor according to one embodiment of the invention.

FIG. 5 is a diagram illustrating a channel extractor 340 according to one embodiment of the invention. In the exemplary diagram of FIG. 5, only two channel outputs are shown. Of course, any number of channel outputs can be generated. The channel extractor 340 includes multiplier-accumulators 510 and 520.

The multiplier-accumulator 510 includes N multipliers $512_0$ to $512_{N-1}$ and one adder 514. The N multipliers $512_0$ to $512_{N-1}$ multiply the $y_0$ to $y_{N-1}$ outputs of the polyphase filter 330, respectively, with the phasor $p_1=e^{j\Theta}{}_1$ from the LUT 350. The phasor $p_1$ corresponds to the selected channel 1. The adder 514 adds all the products generated by the N multipliers $512_0$ to $512_{N-1}$ to produce the channel output 1.

Similarly, the multiplier-accumulator 520 includes N multipliers $522_0$ to $522_{N-1}$ and one adder 514. The N multipliers $522_0$ to $522_{N-1}$ multiply the $y_0$ to $Y_{N-1}$ outputs of the polyphase filter 330, respectively, with the phasor $p_2=e^{j\Theta}{}_2$ from the LUT 350. The phasor P2 corresponds to the selected channel 2. The adder 524 adds all the products generated by the N multipliers $522_0$ to $522_{N-1}$ to produce the channel output 2.

Figure 6:
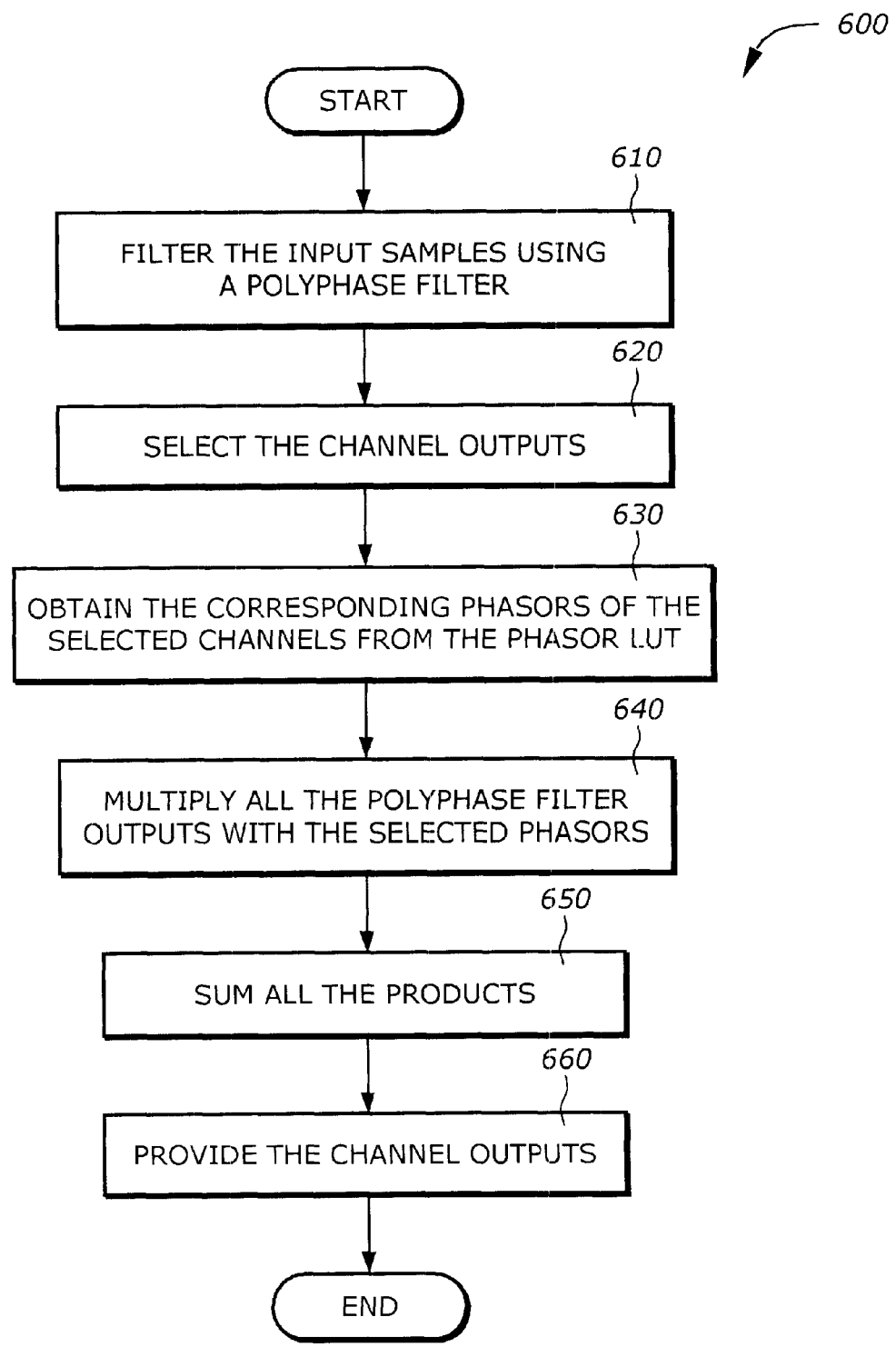
FIG. 6 is a flowchart illustrating a process to generate multi-channel outputs according to one embodiment of the invention.

FIG. 6 is a flowchart illustrating a process 600 to generate multi-channel outputs according to one embodiment of the invention.

Upon START, the process 600 filters the input signal samples using a polyphase filter (Block 610). The input signal samples contain multiple channels and are digitized by appropriate digitization process. Then the process 600 selects the desired channel outputs (Block 620). Typically, this selection is performed by the user who desires to obtain the channel outputs from the input signal. Then the process 600 obtains the corresponding phasors of the selected channels from the phasor look-up table (LUT) (Block 630). This can be done by indexing the LUT using the information provided by the user.

Next, the process 600 multiplies all the outputs of the polyphase filter with the selected phasors provided by the phasor LUT (Block 640). Then the process 600 sums all the products (Block 650). Finally, the process 600 provides the channel outputs as the results of the summing operations (Block 660). The process 600 is then terminated.

Thus, the present invention is a technique to generate multi-channel outputs simultaneously from a single receiver. The technique uses a polyphase filter and a channel extractor to produce the desired channel outputs from an input signal having multiple channels. The channel extractor includes a number of multiplier-accumulators to multiply the outputs of the polyphase filter with phasors corresponding to the selected channels. The technique is simple and flexible to generate multiple channel outputs from a single receiver.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:
    filtering an input signal having N channels by a polyphase filter to generate N filtered signals; and
    extracting one or more channel outputs from the N filtered signal based on one or more phasors corresponding to the one or more channel outputs; wherein filtering comprises generating the N filtered signals by a non-recursive filter having P taps, the P taps corresponding to P coefficients arranged in a two-dimensional array.

2. The method of claim 1 wherein the two-dimensional array has N rows and K columns where K=P/N.

3. A method comprising:

filtering an input signal having N channels by a polyphase filter to generate N filtered signals; and extracting one or more channel outputs from the N filtered signal based on one or more phasors corresponding to the one or more channel outputs; wherein extracting comprises providing the one or more channel outputs using the one or more phasors provided by a phasor LUT by one or more multiplier-accumulators.

4. The method of claim 3 wherein providing the one or more channel outputs comprises:

multiplying the N filtered signals with a phasor value provided by the phase LUT by N multipliers, the phasor value corresponding to a selected channel, the selected channel being one of the one or more channel outputs, the N multipliers generating N products; and adding the N products to produce a channel output by an adder.

5. The method of claim 3 further comprises:

indexing the phasor LUT based on a selection of a user from a user interface.

6. An apparatus comprising:

a polyphase filter to generate N filtered signals from an input signal having N channels; and a channel extractor coupled to the polyphase filter to extract one or more channel outputs from the N filtered signal based on one or more phasors corresponding to the one or more channel outputs; wherein the polyphase filter comprises a non-recursive filter having P taps to generate the N filtered signals, the P taps corresponding to P coefficients arranged in a two-dimensional array.

7. The apparatus of claim 6 wherein the two-dimensional array has N rows and K columns where K=P/N.

8. An apparatus comprising:

a polyphase filter to generate N filtered signals from an input signal having N channels; and a channel extractor coupled to the polyphase filter to extract one or more channel outputs from the N filtered signal based on one or more phasors corresponding to the one or more channel outputs; wherein the channel extractor comprises one or more multiplier-accumulator coupled to the polyphase filter and a phasor look-up table (LUT) to provide the one or more channel outputs using the one or more phasors provided by the phasor LUT.

9. The apparatus of claim 8 wherein each of the one or more multiplier-accumulator comprises:

N multipliers to multiply the N filtered signals with a phasor value provided by the phasor LUT, the phasor value corresponding to a selected channel, the selected channel being one of the one or more channel outputs, the N multipliers generating N products; and an adder coupled to the N multipliers to add the N products to produce a channel output.

10. The apparatus of claim 8 further comprises:

a processor coupled to a user interface to index the phasor LUT based on a selection of a user from a user interface.

11. A system comprising:

a lowpass filter to filter a multi-channel received signal having N channels, the low-pass filter generating an input signal having the N channels;

a digitizer coupled to the lowpass filter to digitize the input signal; and an output generator coupled to the digitizer to generate one or more channel outputs from the input signal, the output generator comprising:

a polyphase filter to generate N filtered signals from the input signal, and a channel extractor coupled to the polyphase filter to extract the one or more channel outputs from the N filtered signal based on one or more phasors corresponding to the one or more channel outputs; wherein the polyphase filter comprises a non-recursive filter having P taps to generate the N filtered signals, the P taps corresponding to P coefficients arranged in a two-dimensional array.

12. The system of claim 11 wherein the two-dimensional array has N rows and K columns where K=P/N.

13. A system comprising:

a lowpass filter to filter a multi-channel received signal having N channels, the low-pass filter generating an input signal having the N channels; and a digitizer coupled to the lowpass filter to digitize the input signal; and an output generator coupled to the digitizer to generate one or more channel outputs from the input signal, the output generator comprising:

a polyphase filter to generate N filtered signals from the input signal, and a channel extractor coupled to the polyphase filter to extract the one or more channel outputs from the N filtered signal based on one or more phasors corresponding to the one or more channel outputs; wherein the channel extractor comprises one or more multiplier-accumulator coupled to the polyphase filter and a phasor look-up table (LUT) to provide the one or more channel outputs using the one or more phasors provided by the phasor LUT.

14. The system of claim 13, wherein each of the one or more multiplier-accumulator comprises:

N multipliers to multiply the N filtered signals with a phasor value provided by the phasor LUT, the phasor value corresponding to a selected channel, the selected channel being one of the one or more channel outputs, the N multipliers generating N products; and an adder coupled to the N multipliers to add the N products to produce a channel output.

15. The system of claim 13 further comprises:

a processor coupled to a user interface to index the phasor LUT based on a selection of a user from a user interface.

* * * * *